United States Patent [19]
Pye

[11] Patent Number: 5,359,237
[45] Date of Patent: Oct. 25, 1994

[54] DC LEVEL GENERATOR
[75] Inventor: Richard Pye, Stockport, England
[73] Assignee: Genrad Limited, United Kingdom
[21] Appl. No.: 897,876
[22] Filed: Jun. 12, 1992
[30] Foreign Application Priority Data
  Jun. 29, 1991 [GB] United Kingdom ............... 9114123
[51] Int. Cl.$^5$ .................... H03K 17/16; H03K 5/24
[52] U.S. Cl. ................................. 307/353; 307/359; 307/494
[58] Field of Search .............. 307/352, 353, 359, 490, 307/494; 328/127, 151, 153

[56] References Cited
U.S. PATENT DOCUMENTS

| | | | |
|---|---|---|---|
| 4,334,195 | 6/1982 | Luce | 307/264 |
| 4,698,523 | 10/1987 | Gershon et al. | 307/353 |
| 4,804,863 | 2/1989 | Welland et al. | 307/353 |
| 4,851,719 | 7/1989 | Hitomi | 307/494 |

*Primary Examiner*—Timothy P. Callahan
*Assistant Examiner*—My-Trang Nu Ton
*Attorney, Agent, or Firm*—Rockey, Rifkin and Ryther

[57] ABSTRACT

A method and apparatus for sequentially refreshing each of an array of sample and hold output circuits in a DC level generator. Each sample and hold circuit makes a selected DC voltage available. For each of the sample and hold output circuits in turn, the voltage which it is desired to store in that circuit is generated. The generated voltage is compared with the voltage stored by that one sample and hold output circuit to produce a voltage difference signal and an error correction storage and hold circuit is charged to a voltage proportional to the voltage difference signal. Charge proportional to the voltage stored in the error correction storage and hold circuit is then transferred to the selected one sample and hold output circuit to reduce the difference between the compared voltages.

4 Claims, 2 Drawing Sheets

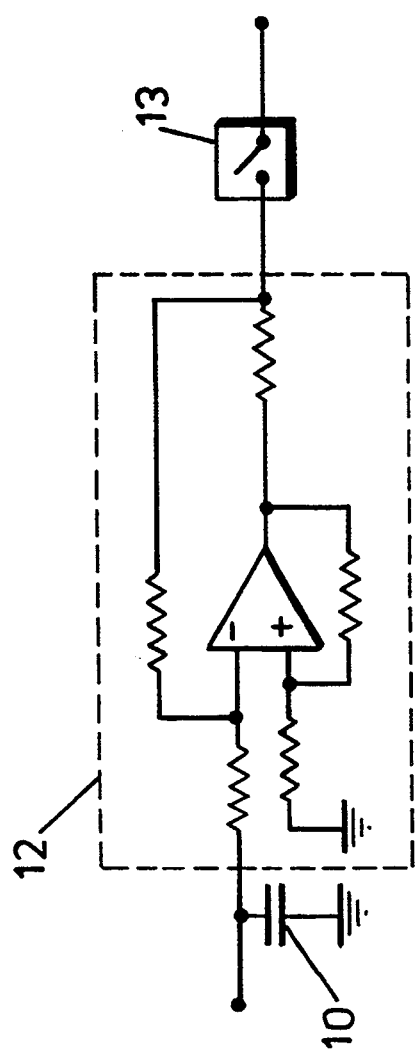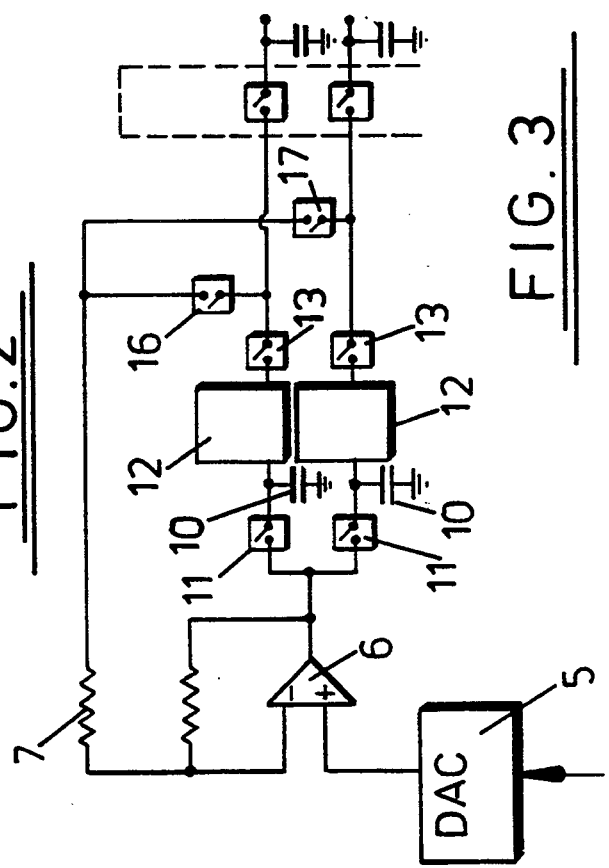

DC LEVEL GENERATOR

The present invention relates to a DC level generator, and to a method for sequentially refreshing each of a plurality of sample and hold output circuits in such a generator.

DC level generators are required for a number of purposes. For example, automatic test equipment is now widely used for testing the operation of circuit boards and integrated circuits. Circuit boards can have a large number of pins, for example two thousand or more, and an automatic tester for such a board must itself have at least several hundred pins and the capability of applying to each of those pins any one of a number of test signals. The test signals include DC levels which are applied in a pre-programmed pattern to output circuits connected to the tester pins to enable the response of the board to be monitored. Typically, each tester pin is connected to an output circuit in the form of an amplifier having two DC level inputs and a control input which controls the amplifier to apply one or other of the DC levels to the tester pin.

In a tester provided with a large number of output pins, hundreds or thousands of controllable DC sources must be provided to enable the appropriate DC levels to be applied to the pins in a pre-programmed manner. These DC sources consume considerable power, space and money and accordingly proposals have been made to reduce the number of DC sources by in effect generating a number of DC levels from a single DC source.

In an article from the Proceedings of the IEEE Custom Integrated Circuits Conference, Boston, Mass., May 13–16, 1990, pp 6.5.1–6.5.4, a design example is given for automatic test equipment incorporating a mixed-signal 7-channel level generator ASIC. In the described circuit, all the control DC voltages required for a single pin of the tester are generated from a single digital to analog convertor which can be controlled to produce each of the required voltages. Voltages are selectively delivered to sample and hold circuits each of which stores a respective DC level. The seven sample and hold circuit (SHAs) are sequentially refreshed or updated automatically from the single main digital to analog converter (DAC). In contrast earlier devices required seven digital to analog converters each linked to a common processor interface.

It would be desirable in a DC level generator with a large number of pins to supply more than one of the pins from a common DAC. Adoption of such an approach does however present its own problems in that the number of sample and hold circuits which can be refreshed from a single DAC depends on the ratio of hold time to refresh time. The hold time is the period for which an SHA can maintain the voltage to which it has been charged without significant voltage droop. The refresh time is the time taken for a single SHA to be refreshed. Typically an SHA consists of four components, that is a front end amplifier, a switch, a capacitor, and a rear end amplifier. In refresh mode, the switch is closed and the front end amplifier charges the capacitor until the capacitor voltage equals the input voltage. The rear end amplifier tracks the capacitor voltage and makes the appropriate voltage available when required. In hold mode, the switch is opened and the front end amplifier does nothing. The rear end amplifier is still tracking the capacitor voltage. Since the capacitor is only connected to the rear end amplifier input (which ideally draws no current), the capacitor retains it charge and voltage. The SHA just holds the voltage at its output.

Thus the hold time is dominated by leakage currents which cause the capacitor voltage to droop. Minimisation of leakage currents is the only way to improve the hold time for a given capacitance. Refresh time depends on the RC time constant of the holding capacitor and the resistance of the charging path. The resistance of the charging path is a significant factor given that analog multiplexer switches are in the charging path. The refresh time also depends on the settling time of the DAC and the front end amplifier. The number of SHAs which can be reliably driven by a single DAC is of course dependent upon the required voltage range, resolution and component accuracy. For example, if we assume that a ten volt range with a twelve-bit resolution is required, the resolution is then 0.025% or 2.5 mV. If we assume a holding capacitor of 0.1 uF, which is a reasonable (physical) size and cost, and a capacitor tolerance of 20%, a switch which has an on-resistance of less than 300 ohms, and a settling time for the front end amplifier of 3 us, including DAC settling time, front end amplifier settling time, and multiplexer switching time, and a maximum leakage current of 300 nA, then the holding time equals (0.08 uF)×(2.5 mV)/(300 nA)=667 us. The refresh time equals (3 us)+(0.12 uF)×(300 ohms) which equals 39 us. Given these figures, the maximum number of SHAs per DAC is 17 (holding time divided by refresh time).

Increasing the holding capacitor size does not help as the charging time increases in proportion to the holding time. Only if the charging time is comparable to the settling time does increasing capacitance help. Reducing accuracy does of course help as if the allowable droop was to be doubled we could provide twice as many SHAs per DAC. Given the design restraints explained above, designers have tended to limit the number of SHAs to 16 SHAs per DAC.

It is an object of the present invention to provide a DC level generator in which the number of SHAs per DAC can be increased.

According to the present invention, there is provided a DC level generator comprising a plurality of sample and hold output circuits each of which is intended to store a DC level, a voltage circuit for sequentially generating each DC level to be stored, and a controller for sequentially connecting each sample and output circuit in turn to the voltage level source to refresh the stored voltage level, wherein the voltage level source circuit comprises means for comparing the voltage stored by each sample and hold output circuit to which it is connected with the generated DC level to be stored by that sample and hold output circuit, an error correction storage and hold circuit for storing charge proportional to the difference between the compared DC voltages, and means for transferring charge proportional to the voltage stored by the error correction storage and hold circuit to the sample and hold output circuit to which the voltage level source circuit is connected to reduce the difference between the compared DC voltages.

The present invention also provides a method for sequentially refreshing each of a plurality of sample and hold output circuits which are provided in a DC level generator to make selected DC voltages available, wherein each sample and hold output circuit is selected in turn, the voltage which it is desired to store in a selected one sample and hold output circuit is generated, the generated voltage is compared with the voltage stored by the selected one sample and hold output circuit to produce a voltage difference signal, an error correction storage and hold circuit is charged to a voltage proportioned to the voltage difference signal, and charge proportional to the voltage stored in the error correction sample and hold circuit is transferred to the selected one sample and hold output circuit to reduce the difference between the compared voltages.

Thus the refresh cycle is split into two parts. In the first part of the cycle, the difference between the desired voltage on the sample and hold output circuit and the actual voltage on that circuit is measured and a voltage proportional to the measured difference is stored. This can be done with accuracy as no current is flowing in the switch connecting the sample and hold output circuit to the measuring circuit. During the second part of the cycle, charge proportional to the stored voltage is supplied through the switch to the holding capacitor of the sample and hold output circuit.

The voltage level source circuit may comprise a first switch connected between the error correction storage and hold circuit and the comparing means, a second switch connected between the error correction storage and hold circuit and a conductor to which each storage and hold output circuit is connected by a respective one of an array of third switches, and a feedback path connected between the comparing means and the conductor, the controller being arranged to open the second switch and close the first switch and one third switch to charge the error correction hold circuit, and thereafter to open the first switch and close the second switch to transfer charge proportional to the voltage stored by the error correction storage and hold circuit to the storage and hold output circuit connected to the closed third switch.

The comparing means may comprise for example an operational amplifier with resistive feedback configured such that its output is a DC voltage level proportional to the difference between a first input received from a digital to analog converter and a second input received from the feedback path.

An amplifier such as a Howland amplifier may be connected between the error correction storage and hold circuit and the second switch.

The storage and hold output circuits may be connected in first and second groups, and first and second error correction sample and hold circuits may be provided. In such an arrangement, the controller may be arranged such that the comparing means stores charge in the first error correction sample and hold circuit at the same time as charge proportional to the voltage previously stored in the second error correction sample and hold circuit is transferred to one of the second group of sample and hold output circuits, and such that the comparing means stores charge in the second error correction sample and hold circuit at the same time as charge proportional to the voltage previously stored in the first error correction sample and hold circuit is transferred to one of the first group of sample and hold output circuits.

Embodiments of the present invention will now be described, by way of example, with reference to the accompanying drawings, in which:

FIG. 2 illustrates the configuration of a Howland amplifier suitable for incorporation in the circuit of FIG. 1; and FIG. 3 illustrates a portion of a second embodiment of the present invention.

Figure 1:
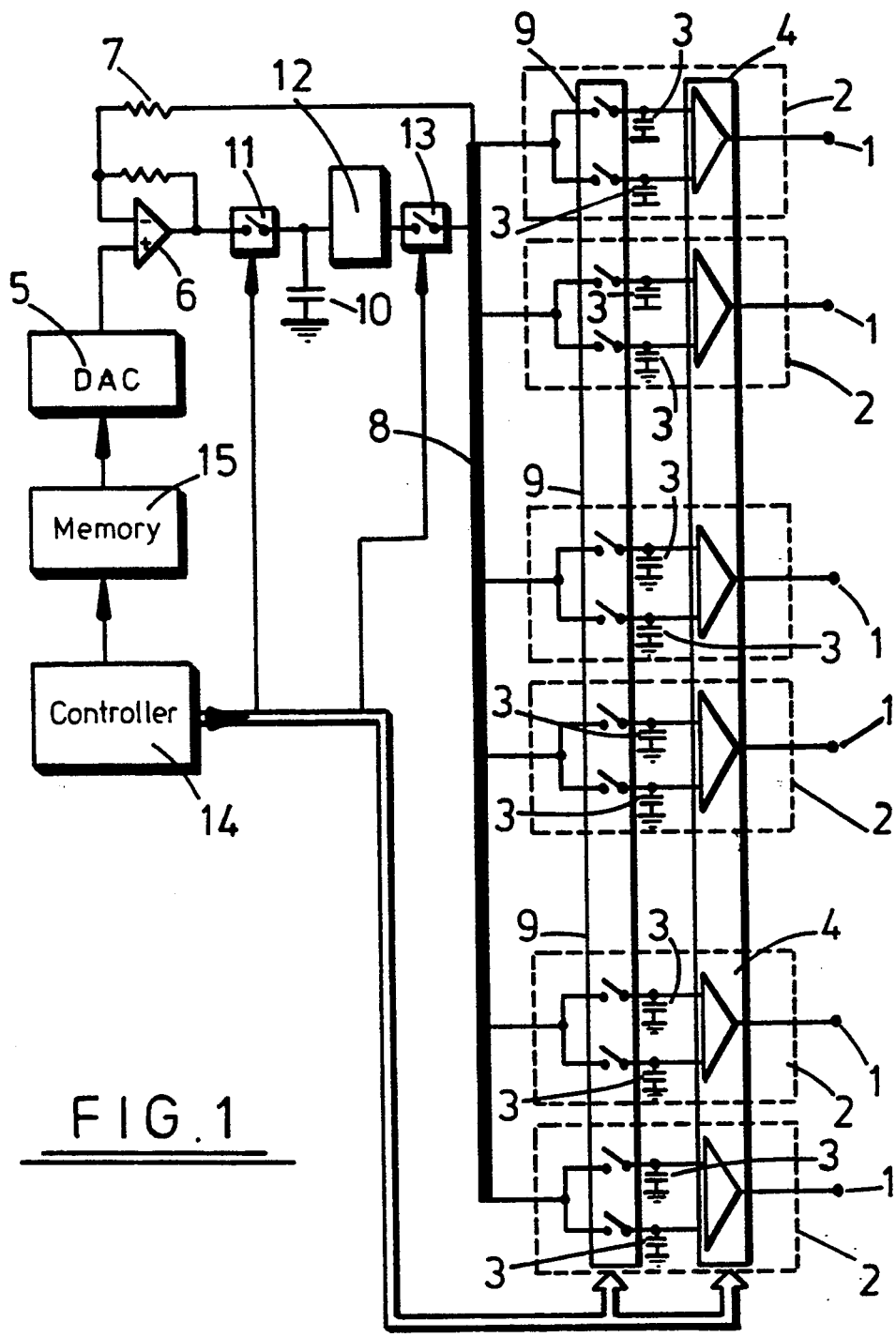
FIG. 1 is a simplified schematic block diagram of a first embodiment of the present invention.

Referring to FIG. 1, with a view to simplifying the drawing the illustrated embodiment of the invention comprises only six output pins 1 each connected to a respective block 2 of sample and hold output circuits. Each block of sample and hold output circuits comprises only two sample and hold circuits each in the form of a capacitor 3. The capacitor 3 and the output pins 1 are interconnected by output circuits 4. Typically each output circuit will comprise an amplifier having two inputs connected to respective capacitors 3, and a switchable control input to drive the amplifier output to be equal to the voltage on one or other of the capacitors. The amplifier output is connected to a respective pin 1. Each pin will also be connected to further circuits e.g., comparators for monitoring the pin voltage, and a current loading circuit to simulate current loadings on the pin, but such further circuits are not described herein as they are not directly relevant to DC level generation. It will be appreciated that in a practical embodiment of the invention many more pins and associated sample and hold circuits will be provided. For example there will typically be several hundred output pins corresponding to the pins 1.

In prior art devices, each of the blocks 2 of sample and hold circuits is typically provided with its own DC level generator so that each of the capacitors 3 may be charged up to an appropriate DC level. That DC level can then be applied to the appropriate output circuit 4. The present invention makes it possible to supply many more of the sample and hold circuit blocks 2 from a single DC source.

As illustrated in FIG. 1, the DC generator comprises a digital to analog converter 5 the output of which is supplied to one terminal of an operational amplifier 6 with resistive feedback configured such that its output is a DC voltage level. That DC level is proportional to the difference between the input received from the converter 5 and an input received via a feedback resistor 7 connected to a conductor 8 to which each of the capacitors 3 can be connected by closure of an appropriate switch in a bank of switches 9. The amplifier 6 may have a gain of for example twenty. A single error correction sample and hold circuit in the form of a capacitor 10 can be connected either to the output of the amplifier via a switch 11 or to the conductor 8 via an amplifier 12 and a switch 13. The amplifier 12 may have a gain of for example one or two.

The switch bank 9, and the switches 11 and 13, are controlled by a controller 14 which also controls the converter 5 via memory 15. A further controller (not shown) controls the output circuit 4. For example, if it is assumed that the controller is operating a test programme which requires the uppermost capacitor 3 in the uppermost bank 2 of sample and hold output circuits to store five volts and to deliver that five volts level to the uppermost input to the associated circuit 4, the controller 14 provides an output to the memory 15 identifying the capacitor 3 the charge on which is to be controlled. The memory stores data associated with that capacitor 3 indicating that a five volts level is to be stored by that capacitor and generates a control output which causes the converter 5 to apply a five volts DC level to the positive terminal of the amplifier 6. At this stage in the cycle, the controller has closed switch 11, opened switch 13, and closed the uppermost switch in the switch bank 9. The voltage on the capacitor 3 is fed back via resistor 7 to the negative input of the amplifier 6 and thus the capacitor 10 is charged up to a voltage level equal to the difference between the voltage on the output of the converter 5 and the voltage across the capacitor 3.

Once the capacitor 10 has been charged to an appropriate level, the switch 11 is opened and thereafter the switch 13 is closed. Charge proportional to the voltage on the capacitor 10 is then transferred to the uppermost one of the capacitors 3. Thus the charge on the capacitor 3 is refreshed such that the voltage across that capacitor is substantially the same as the intended voltage as output from the converter 5.

Each of the capacitors 3 is refreshed in turn. The settling time of the various circuit components is relatively brief and accordingly a relatively large number of sample and hold output circuits can be refreshed by the single DC level generator. It may be appropriate in some circumstances to add extra resistance in the path through which charge is transferred to the capacitor 3 so as to prevent excessive currents damaging the switches in the switch bank 9. This may not be necessary given an appropriate structure for the amplifier 12.

FIG. 2 illustrates one such structure in the form of a Howland amplifier. Such amplifiers generate an output current which is proportional to the input voltage, that is in this application the voltage across capacitor 10 (see FIG. 1). Thus the required charge can be delivered as soon as possible without exceeding maximum acceptable currents through the switches. Although Howland amplifiers are known to be inaccurate the use of such an amplifier in a closed loop as shown enables acceptable performance to be achieved.

It will be appreciated from the description of FIG. 1 that the circuit operates cyclically with each cycle having a first part in which charge is built up on the capacitor 10 and the second part in which charge proportional to the voltage previously built up on the capacitor 10 is transferred to one of the capacitors 3. This makes it possible to double the number of sample and hold output circuits driven from the single DC level generator as compared with the circuit of FIG. 1 by arranging the sample and hold output circuits in two groups each of which is supplied with charge from a respective error correction sample and hold circuit. Such an arrangement is illustrated in FIG. 3.

Referring to FIG. 3, the same reference numerals are used in FIGS. 1 and 2 for equivalent components. Thus it will again be seen that there is a single comparator in the form of amplifier 6. There are however two error correction sample and hold circuits in the form of capacitors 10, each capacitor 10 been connected between a respect pair of switches 11 and 13. The feedback path incorporating resistor 7 can be either connected to an upper channel incorporating one of the switches 13 via switch 16 or a lower channel incorporating one of the switches 13 via switch 17. The upper channel is connected to a first group of sample and hold output circuit blocks of the type indicated by reference numeral 2 in FIG. 1 and the lower channel is connected to an identical group of sample and hold output circuit blocks. In FIG. 3, only one sample and hold capacitor 3 is illustrated for each of these groups of sample and hold output circuits.

The circuit of FIG. 3 operates such that as the upper capacitor 10 is being charged up to a level determined by the voltage fed back through the switch 16, the voltage stored in the lower capacitor 10 is causing charge to be transferred through the lower switch 13 to the lower capacitor 3. Thereafter the switch 16 is opened and the switch 17 is closed and the second half of the cycle is followed such that the upper capacitor 3 is charged to an appropriate level determined by the previously stored voltage level on the upper capacitor 10 as the lower capacitor 10 is charged. It will be appreciated that the two parts of the cycle must be of substantially the same duration and that accordingly the settling time of the various circuit components must be appropriately selected. This can however be done and accordingly the arrangement of FIG. 3 essentially doubles the number of sample and hold output circuits which can be refreshed from a single digital to analog converter DC level generator.

It will be appreciated that various modifications could be made to the circuits described. For example, the amplifier 12 could be other than a Howland amplifier. In some circumstances if relatively slow operation is acceptable the amplifier 12 could be replaced by a direct connection such that charge is simply shared between the capacitor 10 and the capacitor 3 to which it is connected. It will also be appreciated that circuit features not directly relevant to DC generation have been omitted. For example, the blocks 2 of sample and hold circuits will typically be connected to the conductor 8 via isolating switches to enable faulty circuits to be isolated, and to reduce the effective capacitance of the conductor 8.

I claim:

1. A DC level generator comprising a plurality of sample and hold output circuits, each of which is intended to store a DC level, a voltage level source circuit for sequentially generating each DC level to be stored, and a controller for sequentially connecting each sample and hold output circuit in turn to the voltage level source circuit to refresh the stored voltage level, wherein the voltage level source circuit comprises means for comparing the voltage stored by each sample and hold output circuit to which it is connected with the generated DC level to be stored by that sample and hold output circuit, an error correction storage and hold circuit for storing charge proportional to the difference between the compared DC voltages, and means for transferring charged proportional to the voltage stored by the error correction storage and hold circuit to the storage and hold output circuit to which the voltage level source circuit is connected to reduce the difference between the compared DC voltages, wherein the voltage level source circuit comprises a first switch connected between the error correction storage and hold circuit and the comparing means, a second switch connected between the error storage and hold circuit and a conductor to which each storage and hold output circuit is connected by a respective one of an array of third switches, and a feedback path connected between the comparing means and the conductor, and wherein the controller is arranged to open the second switch and close the first switch and one third switch to charge the error correction storage and hold circuit, and thereafter to open the first switch and close the second switch to transfer charge proportional to the voltage stored by the error correction storage and hold circuit to the storage and hold output circuit connected to the closed third switch.

2. A DC level generator according to claim 1, wherein the comparing means comprises an operational amplifier with resistive feedback configured such that its output is a DC voltage level proportional to the difference between a first input received from a digital to analog converter and a second input received from the feedback path.

3. A DC level generator according to claim 1 or 2 wherein an amplifier is connected between the error correction storage and hold circuit and the second switch.

4. A DC level generator according to claim 1 wherein the storage and hold output circuits are connected in the first and second groups, and first and second error correction sample comparing means stores charge on the first error correction sample and hold circuit at the same time as charge proportional to the voltage previously stored in the second error correction sample and hold circuit is transferred to one of the second group of sample and hold output circuits, and such that the comparing means stores charge in the second error correction sample and hold circuit at the same time as charge proportional to the voltage previously stored in the first error correction samples and hold circuit is transferred to one of the first group of sample and hold circuits.

* * * * *